(12) United States Patent
Park et al.

(10) Patent No.: US 7,999,270 B2
(45) Date of Patent: Aug. 16, 2011

(54) III-NITRIDE COMPOUND SEMICONDUCTOR LIGHT EMITTING DEVICE COMPRISING LAYER WITH PINHOLE STRUCTURE

(75) Inventors: Eun Hyun Park, Seongnam-si (KR); Tae-Kyung Yoo, Yongin-si (KR)

(73) Assignee: Epivalley Co., Ltd., Kyungsangbuk-do (KR)

( * ) Notice: Subject to any disclaimer, the term of this patent is extended or adjusted under 35 U.S.C. 154(b) by 196 days.

(21) Appl. No.: 12/085,150

(22) PCT Filed: Nov. 15, 2006

(86) PCT No.: PCT/KR2006/004813
§ 371 (c)(1),
(2), (4) Date: May 15, 2009

(87) PCT Pub. No.: WO2007/058474
PCT Pub. Date: May 24, 2007

(65) Prior Publication Data
US 2010/0032689 A1    Feb. 11, 2010

(30) Foreign Application Priority Data

Nov. 16, 2005 (KR) ........................ 10-2005-0109423

(51) Int. Cl.
*H01L 33/00* (2010.01)
(52) U.S. Cl. .............. 257/87; 257/103; 257/13; 257/79; 257/918; 257/E51.018; 257/E51.022; 257/E33.001; 257/E25.028; 257/E25.032; 257/80; 257/81; 257/86

(58) Field of Classification Search .................... 257/13, 257/79, 103, 918, E51.018, E51.022, E33.001, 257/87, 80, 81, 86
See application file for complete search history.

(56) References Cited

U.S. PATENT DOCUMENTS

| | | | |
|---|---|---|---|
| 5,122,845 A | 6/1992 | Manabe et al. | |
| 5,247,533 A | 9/1993 | Okazaki et al. | |
| 5,290,393 A | 3/1994 | Nakamura | |
| 5,306,662 A | 4/1994 | Nakamura et al. | |
| 5,563,422 A | 10/1996 | Nakamura et al. | |
| 5,652,434 A | 7/1997 | Nakamura et al. | |
| 5,733,796 A | 3/1998 | Manabe et al. | |
| 6,194,743 B1 | 2/2001 | Kondoh et al. | |
| 6,515,306 B2 | 2/2003 | Kuo et al. | |
| 7,512,168 B2 * | 3/2009 | Ohmi ..................... | 372/46.01 |
| 7,777,241 B2 * | 8/2010 | Moustakas et al. ............ | 257/95 |
| 2005/0082545 A1 * | 4/2005 | Wierer et al. ................... | 257/79 |

(Continued)

FOREIGN PATENT DOCUMENTS
KR    10-2001-0003710    1/2001
(Continued)

*Primary Examiner* — Wael M Fahmy
*Assistant Examiner* — Marc Armand
(74) *Attorney, Agent, or Firm* — Harness, Dickey & Pierce, P.L.C.; Michael J. Thomas; Kisuk Lee (57) ABSTRACT

The present invention discloses a III-nitride compound semiconductor light emitting device having an n-type nitride compound semiconductor layer, an active layer grown on the n-type nitride compound semiconductor layer, for generating light by recombination of electron and hole, and a p-type nitride compound semiconductor layer grown on the active layer. The III-nitride compound semiconductor light emitting device includes a plurality of semiconductor layers including a nitride compound semiconductor layer with a pinhole structure grown on the p-type nitride compound semiconductor layer.

14 Claims, 5 Drawing Sheets

U.S. PATENT DOCUMENTS

| | | | |
|---|---|---|---|
| 2005/0163179 A1* | 7/2005 | Hooper et al. | 372/45 |
| 2006/0273333 A1* | 12/2006 | Wu et al. | 257/94 |

FOREIGN PATENT DOCUMENTS

| | | |
|---|---|---|
| KR | 10-2003-0052060 | 6/2003 |
| KR | 1020040042311 | 5/2004 |
| KR | 10-2004-0050279 | 6/2004 |
| KR | 10-2005-0045042 | 5/2005 |
| KR | 10-2005-0100485 | 10/2005 |
| WO | 02/21121 | 3/2002 |
| WO | 2005/022655 | 3/2005 |
| WO | 2005/053042 | 6/2005 |

* cited by examiner

III-NITRIDE COMPOUND SEMICONDUCTOR LIGHT EMITTING DEVICE COMPRISING LAYER WITH PINHOLE STRUCTURE

CROSS-REFERENCE TO RELATED APPLICATIONS

This application is a U.S. national stage filing under 35 U.S.C. §371 of International Application No. PCT/KR2006/004813 filed Nov. 15, 2006, and claims priority to Korean Application No. 10-2005-0109423 filed Nov. 16, 2005. The disclosures of the aforementioned applications are incorporated herein by reference in their entireties.

TECHNICAL FIELD

The present invention relates to a III-nitride compound semiconductor light emitting device, and more particularly, to a III-nitride compound semiconductor light emitting device which can improve external quantum efficiency and lower a driving voltage, by forming a nitride compound semiconductor layer with a pinhole structure inside a nitride compound semiconductor layer. Here, the III-nitride compound semiconductor light emitting device means a light emitting device such as a light emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material composed of other group elements, such as SiC, SiN, SiCN and CN, and a semiconductor layer made of such a material.

BACKGROUND ART

Figure 1:
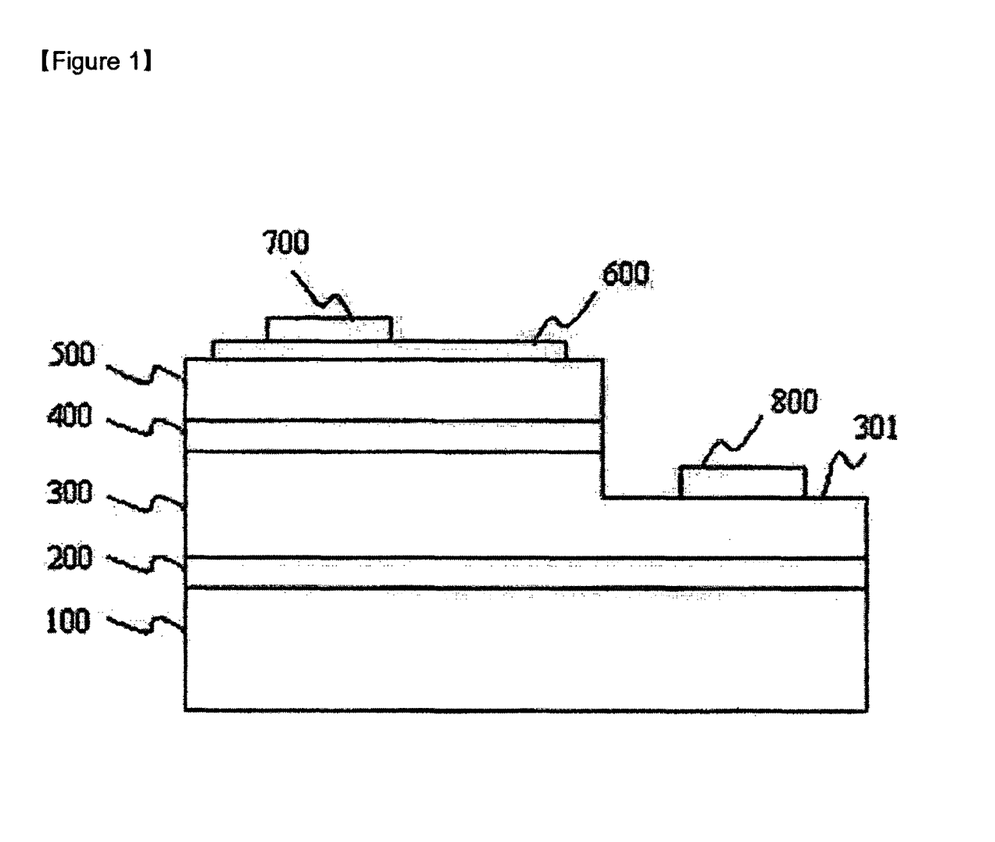
FIG. 1 is a cross-sectional view illustrating one example of a conventional semiconductor light emitting device.

FIG. 1 is a cross-sectional view illustrating one example of a conventional semiconductor light emitting device. The conventional semiconductor light emitting device includes a substrate 100, a buffer layer 200 epitaxially grown on the substrate 100, an n-type nitride compound semiconductor layer 300 epitaxially grown on the buffer layer 200, an active layer 400 epitaxially grown on the n-type nitride compound semiconductor layer 300, a p-type nitride compound semiconductor layer 500 epitaxially grown on the active layer 400, a p-side electrode 600 formed over the p-type nitride compound semiconductor layer 500, a p-side bonding pad 700 formed on the p-side electrode 600, and an n-side electrode 800 formed on an exposed n-type nitride compound semiconductor layer 301 formed by mesa-etching the p-type nitride compound semiconductor layer 500 and the active layer 400.

In the case of the substrate 100, a GaN substrate can be used as a homo-substrate, and a sapphire substrate, a SiC substrate or a Si substrate can be used as a hetero-substrate. However, any kinds of substrates on which the nitride compound semiconductor layers can be grown can be used.

The nitride compound semiconductor layers epitaxially grown over the substrate 100 are mostly grown by the metal organic chemical vapor deposition (MOCVD). The buffer layer 200 serves to overcome differences in lattice parameter and thermal expansion coefficient between the hetero-substrate 100 and the nitride compound semiconductor. U.S. Pat. No. 5,122,845 discloses a method for growing an AlN buffer layer having a thickness of 100 to 500 Å on a sapphire substrate at 380 to 800° C. U.S. Pat. No. 5,290,393 discloses a method for growing an $Al_{(x)}Ga_{(1-x)}N$ ($0 \leq x \leq 1$) buffer layer having a thickness of 10 to 5000 Å on a sapphire substrate at 200 to 900° C. The international publication official gazette WO/051053042 discloses a method for growing a SiC buffer layer (seed layer) at 600 to 990° C., and growing an $In_{(x)}Ga_{(1-x)}N$ ($0 \leq x \leq 1$) layer thereon.

In the n-type nitride compound semiconductor layer 300, at least the n-side electrode 800 formed region (n-type contact layer) is doped with a dopant. Preferably, the n-type contact layer is made of GaN and doped with Si. U.S. Pat. No. 5,733,796 discloses a method for doping an n-type contact layer at a target doping concentration by controlling a mixture ratio of Si and another source material.

The active layer 400 generates light quantum (light) by recombination of an electron and a hole. Normally, the active layer 400 is made of $In_{(x)}Ga_{(1-x)}N$ ($0 \leq x \leq 1$) and comprised of single quantum well or multi quantum wells. The international publication official gazette WO/02/021121 discloses a method for partially doping a plurality of quantum well layers and barrier layers.

The p-type nitride compound semiconductor layer 500 is doped with an appropriate dopant such as Mg, and provided with p-type conductivity by activation process. U.S. Pat. No. 5,247,533 discloses a method for activating a p-type nitride compound semiconductor layer by electron beam radiation. U.S. Pat. No. 5,306,662 discloses a method for activating a p-type nitride compound semiconductor layer by annealing at 400° C. and over. Also, the international publication official gazette WO/05/022655 discloses a method for endowing a p-type nitride compound semiconductor layer with p-type conductivity without activation, by using ammonia and a hydrogen group source material as a nitrogen precursor for the growth of the p-type nitride compound semiconductor layer.

The p-side electrode 600 facilitates current supply to the whole p-type nitride compound semiconductor layer 500. U.S. Pat. No. 5,563,422 discloses a light transmitable electrode formed almost on the whole surface of a p-type nitride compound semiconductor layer to ohmic-contact the p-type nitride compound semiconductor layer, and composed of Ni and Au. U.S. Pat. No. 6,515,306 discloses a method for forming an n-type super lattice layer on a p-type nitride compound semiconductor layer, and forming a light transmitting electrode made of ITO thereon.

On the other hand, the p-side electrode 600 can be formed thick not to transmit light, namely, to reflect light to the substrate side. A light emitting device using the p-side electrode 600 is called a flip chip. U.S. Pat. No. 6,194,743 discloses an electrode structure including an Ag layer having a thickness 20 nm and over, a diffusion barrier layer for covering the Ag layer, and a bonding layer made of Au and Al for covering the diffusion barrier layer.

The p-side bonding pad 700 and the n-side electrode 800 are formed for current supply and external wire bonding. U.S. Pat. No. 5,563,422 discloses a method for forming an n-side electrode with Ti and Al, and U.S. Pat. No. 5,652,434 discloses a method for making a p-side bonding pad directly contact a p-type nitride compound semiconductor layer by removing a part of a light transmitting electrode.

One of the disadvantages of the III-nitride compound semiconductor light emitting device is that a large amount of light generated in the active layer 400 is confined inside the device and the substrate 100 due to a refractive index difference between the device and the ambient air.

In the device showing serious light confinement, namely, the device having low external quantum efficiency, a large amount of light is confined and vanished as heat. Accordingly, a temperature of the device rises, which has detrimental effects on the lifespan and property of the device.

External quantum efficiency can be improved by mechanically processing a chip shape of the light emitting device, or roughening the surface of the semiconductor layer by chemical etching or dry etching. Recently, in the growth of the p-type nitride compound semiconductor layer 500, the surface is roughened by deteriorating quality of thin film by using the growth conditions such as pressure, temperature and gas flow. The mechanical processing is suitable for the substrate having low hardness such as SiC. However, it is difficult to mechanically process the substrate having high hardness such as sapphire. In addition, when the surface of the semiconductor layer is roughened by chemical etching or dry etching, the roughened area is limited and reproducibility and uniformity are bad.

In the case that the surface of the p-type nitride compound semiconductor layer 500 is roughened by changing the growth conditions, external quantum efficiency of the device is improved, but reliability thereof is seriously reduced.

DISCLOSURE

Technical Problem

An object of the present invention is to provide a III-nitride compound semiconductor light emitting device which has a new structure of increasing external emission of light generated by an active layer.

Technical Solution

There is provided a III-nitride compound semiconductor light emitting device comprising an n-type nitride compound semiconductor layer, an active layer grown over the n-type nitride compound semiconductor layer for generating light by recombination of electron and hole, a p-type nitride compound semiconductor layer grown on the active layer, and a plurality of semiconductor layers including a nitride compound semiconductor layer with a pinhole structure grown over the p-type nitride compound semiconductor layer.

In another aspect of the invention, the plurality of semiconductor layers include a nitride compound semiconductor layer with n-type conductivity at the lower portion of the nitride compound semiconductor layer with the pinhole structure.

In another aspect of the invention, the plurality of semiconductor layers further include a nitride compound semiconductor layer with p-type conductivity at the upper portion of the nitride compound semiconductor layer with the pinhole structure.

In another aspect of the invention, the nitride compound semiconductor layer with p-type conductivity is grown at a first growth temperature, the nitride compound semiconductor layer with the pinhole structure is grown at a second growth temperature, and the first growth temperature is higher than the second growth temperature.

In another aspect of the invention, the nitride compound semiconductor layer with the pinhole structure has p-type conductivity.

In another aspect of the invention, the nitride compound semiconductor layer with n-type conductivity has a thickness of 100 Å and below.

In another aspect of the invention, at least one nitride compound semiconductor layer with n-type conductivity is formed below 100 inside the semiconductor layer with the pinhole structure and the nitride compound semiconductor layer with p-type conductivity, respectively.

In addition, there is provided a III-nitride compound semiconductor light emitting device comprising an n-type nitride compound semiconductor layer, an active layer grown on the n-type nitride compound semiconductor layer for generating light by recombination of electron and hole, a p-type nitride compound semiconductor layer grown on the active layer, a nitride compound semiconductor layer with a pinhole structure grown on the p-type nitride compound semiconductor layer, a masking film and a plurality of nitride compound semiconductor layers grown after the growth of the nitride compound semiconductor layer with the pinhole structure.

In another aspect of the invention, the masking film is made of a material selected from the group consisting of SiN, CN, MgN and SiCN.

In another aspect of the invention, the nitride compound semiconductor layer with p-type conductivity is formed in an island shape.

In another aspect of the invention, the plurality of nitride compound semiconductor layers include a supplementary nitride compound semiconductor layer with p-type conductivity grown on the nitride compound semiconductor layer with p-type conductivity.

In another aspect of the invention, the nitride compound semiconductor layer with p-type conductivity is grown at a first growth temperature, the supplementary nitride compound semiconductor layer with p-type conductivity is grown at a second growth temperature, and the first growth temperature is lower than the second growth temperature.

ADVANTAGEOUS EFFECTS

In accordance with the present invention, the III-nitride compound semiconductor light emitting device can improve external quantum efficiency, by forming the nitride compound semiconductor layer with the pinhole structure and the nitride compound semiconductor layer with the hillock structure on the p-type nitride compound semiconductor layer at the upper portion of the active layer.

MODE FOR INVENTION

The present invention will now be described in detail with reference to the accompanying drawings.

Figure 2:
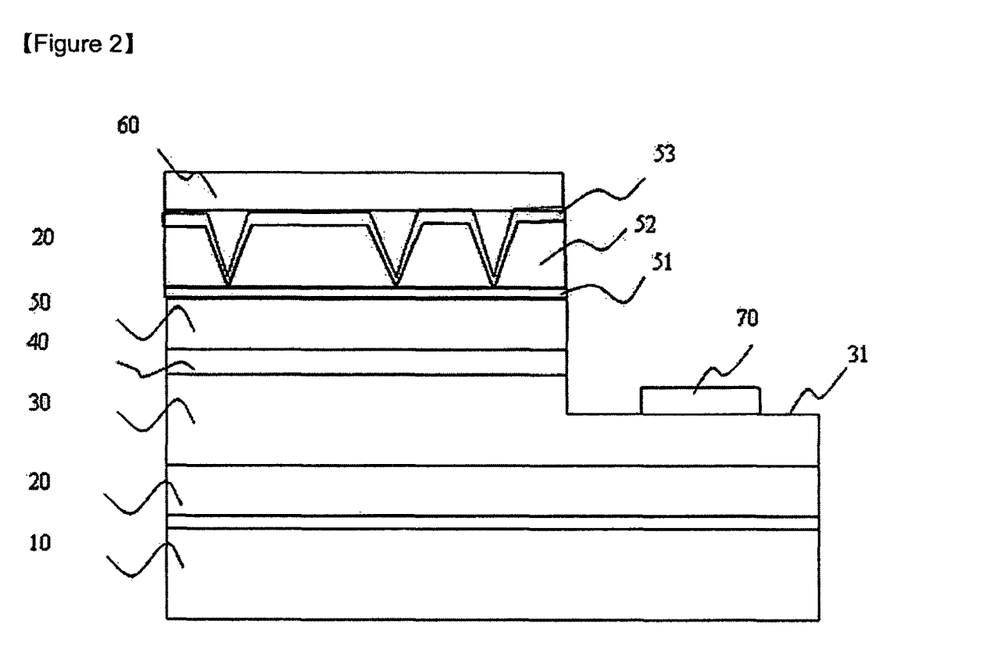
FIG. 2 is a cross-sectional view illustrating a III-nitride compound semiconductor light emitting device in accordance with one embodiment of the present invention.

FIG. 2 is a cross-sectional view illustrating a III-nitride compound semiconductor light emitting device in accordance with one embodiment of the present invention. The III-nitride compound semiconductor light emitting device comprises a substrate 10, a buffer layer 20 epitaxially grown on the substrate 10, an n-type nitride compound semiconductor layer 30 epitaxially grown on the buffer layer 20, an active layer 40 epitaxially grown on the n-type nitride compound semiconductor layer 30, a p-type nitride compound semiconductor layer 50 epitaxially grown on the active layer 40, a first level nitride compound semiconductor layer 51 with n-type conductivity grown on the p-type nitride compound semiconductor layer 50, a second level nitride compound semiconductor layer 52 with p-type conductivity grown on the first level nitride compound semiconductor layer 51 with n-type conductivity, a third level nitride compound semiconductor layer 53 with p-type conductivity grown on the second level nitride compound semiconductor layer 52 with p-type conductivity, a light transmitable electrode 60 formed on the third level nitride compound semiconductor layer 53 with p-type conductivity, and an n-side electrode 70 formed on an exposed n-type nitride compound semiconductor layer 31 by mesa-etching at least the p-type nitride compound semiconductor layer 50 and the active layer 40.

The light transmitable electrode 60 contains at least one selected from the group consisting of Ni, Au, Ag, Cr, Ti, Pt, Pd, Rh, Ir, Al, Sn, ITO, In, Ta, Cu, Co, Fe, Ru, Zr, W and Mo.

The first level nitride compound semiconductor layer 51 with n-type conductivity is formed by Si doping. Generally, in the growth of the nitride compound thin film, Mg doping facilitates the lateral growth and Si doping facilitates the vertical growth. Therefore, Mg doping planarizes the surface of the thin film by covering pits, and Si doping helps the three-dimensional growth by restricting the horizontal growth.

In on aspect of the present invention, the first level nitride compound semiconductor layer 51 with n-type conductivity by Si doping is formed on the p-type nitride compound semiconductor layer 50 of the general nitride compound semiconductor light emitting device, so that high density pinholes can be formed on the second level nitride compound semiconductor layer 52 with p-type conductivity grown on the first level nitride compound semiconductor layer 51 with n-type conductivity. Preferably, the first level nitride compound semiconductor layer 51 with n-type conductivity has a thickness 100 Å and below, in consideration of a tunneling effect. If the thickness of the first level nitride compound semiconductor layer 51 with n-type conductivity is over 100 Å, the holes cannot efficiently pass through the second level nitride compound semiconductor layer 52 with p-type conductivity, thereby seriously reducing light emitting efficiency.

Preferably, the Si doping concentration of the first level nitride compound semiconductor layer 51 with n-type conductivity ranges from $1\times10^{17}$ to $1\times10^{20}$. If the doping concentration is lower than $1\times10^{17}$, the first level nitride compound semiconductor layer 51 with n-type conductivity does not efficiently contribute to the pinhole density increase of the second level nitride compound semiconductor layer 52 with p-type conductivity. If the doping concentration is higher than $1\times10^{20}$, quality of the thin film is deteriorated to reduce reliability of the device.

The second level pinhole structure nitride compound semiconductor layer 54 with p-type conductivity must be grown at a temperature lower than the growth temperature of the general nitride compound thin film to have hexagonal pinholes. That is, when the growth temperature is lowered, mobility of atoms to move toward a low energy region on the surface is reduced.

It is known that the hexagonal pinholes are generally formed on the basis of lower level lattice defects. The lattice defects are generated on the first level nitride compound semiconductor layer 51 with n-type conductivity. The first level nitride compound semiconductor layer 51 facilitates the vertical growth due to Si doping. Therefore, high density pinholes are formed on the second level nitride compound semiconductor layer 52 with p-type conductivity. In accordance with the present invention, the first level nitride compound semiconductor layer 51 with n-type conductivity serves as a seed for forming the high density hexagonal pinholes in the second level nitride compound semiconductor layer 52 with p-type conductivity.

Preferably, the growth temperature of the second level nitride compound semiconductor layer 52 ranges from 600 to 1000° C. If the growth temperature is lower than 600° C., quality of the thin film is extremely deteriorated. It is thus difficult to form a semiconductor layer with p-type conductivity. Because ammonia has low thermal decomposition efficiency at a low temperature, nitrogen-free spaces are excessively formed and operated as donors. If a source that can be thermally decomposed at a low temperature such as hydrazine is used, the thin film can be grown at a lower temperature. However, basically, when the thin film is grown at a low temperature, incorporation efficiency of impurities increases.

If the growth temperature is low, mobility of atoms on the surface is reduced. Accordingly, the pinholes can be formed with a higher density. Conversely, as mentioned above, if the growth temperature is lowered, it is very difficult to obtain the semiconductor layer with p-type conductivity. In this aspect, the high density pinholes can be formed at a relatively high temperature by forming the first level nitride compound semiconductor layer 51 with n-type conductivity.

In the growth of the second level nitride compound semiconductor layer 52 with p-type conductivity, the flow quantity of ammonia is preferably set larger than that of the general growth conditions. As the temperature is lowered, the thermal decomposition efficiency of ammonia is reduced. Therefore, the flow quantity of ammonia is increased to compensate for the low thermal decomposition efficiency.

Preferably, the thickness of the second level nitride compound semiconductor layer 52 with p-type conductivity ranges from 500 to 10000 Å. If the thickness of the second level nitride compound semiconductor layer 52 is below 500 Å, the high density pinhole structure is hard to be achieved thereon. If the thickness of the second level nitride compound semiconductor layer 52 is over 10000 Å, quality of the thin film is reduced. The second level nitride compound semiconductor layer 52 can be formed by using a single semiconductor layer with p-type conductivity, or inserting a semiconductor layer with n-type conductivity. In this case, the semiconductor layer with n-type conductivity is preferably formed below 100 Å, in consideration of the hole tunneling. The semiconductor layer with n-type conductivity improves horizontal hole spreading, and forms the high density uniform pinhole structure by restricting the horizontal growth.

The third level nitride compound semiconductor layer 53 with p-type conductivity which serves as a contact layer is grown at 700 to 1100° C., which is higher than the growth temperature of the second level nitride compound semiconductor layer 52 with p-type conductivity. To obtain a high quality thin film and improve the doping concentration and hole concentration, it is advantageous to grow the third level nitride compound semiconductor layer 53 at a high temperature. However, if the third level nitride compound semiconductor layer 53 is grown at a high temperature over 1100° C., the active layer 40 is damaged. Furthermore, the hexagonal pinholes formed on the second level nitride compound semiconductor layer 52 with p-type conductivity may be planarized during the growth of the third level nitride compound semiconductor layer 53 with p-type conductivity. Accordingly, the great care must be taken in growing the third level nitride compound semiconductor layer 53 with p-type conductivity.

In order to solve the foregoing problem, in accordance with the present invention, after the second level nitride compound semiconductor layer 52 with p-type conductivity is grown, the third level nitride compound semiconductor layer 53 with p-type conductivity is consecutively grown. Here, while the third level nitride compound semiconductor layer 53 is grown, a temperature of a reactor is getting raised.

In addition, the third level nitride compound semiconductor layer 53 with p-type conductivity can be formed by using a single semiconductor layer with p-type conductivity, or inserting a semiconductor layer with n-type conductivity. In this case, the semiconductor layer with n-type conductivity is preferably formed below 100 Å, in consideration of the hole tunneling. The semiconductor layer with n-type conductivity improves horizontal hole spreading, and forms the high density uniform pinhole structure by restricting the horizontal growth.

Preferably, the second level nitride compound semiconductor layer 52 with p-type conductivity and the third level nitride compound semiconductor layer 53 with p-type conductivity are provided with different refractive indexes by changing the composition or density.

Figure 3:
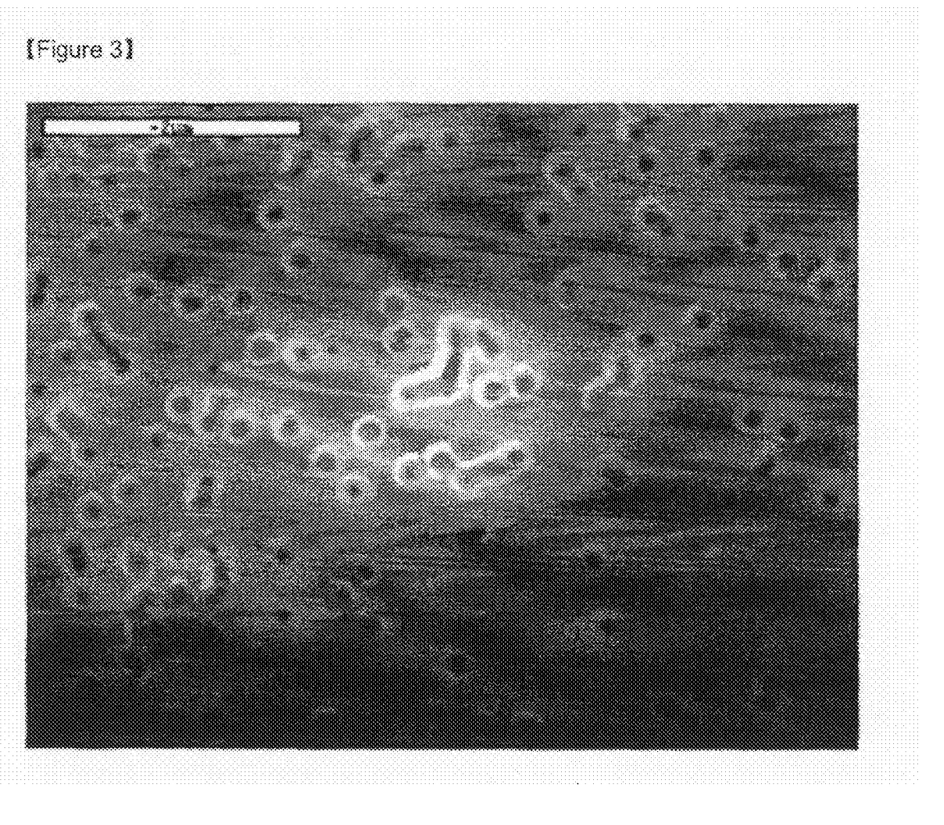
FIG. 3 is a photograph showing a surface of a second level nitride compound semiconductor layer in accordance with the present invention.

FIG. 3 is a photograph showing the surface of the second level nitride compound semiconductor layer with p-type conductivity, especially an SEM photograph showing the surface of the light emitting device in accordance with the present invention. The first level nitride compound semiconductor layer 51 with n-type conductivity was a Si-doped GaN layer grown 30 Å at the doping concentration of $8 \times 10^{18}/cm^3$. The growth temperature was about 850° C. not to damage the active layer 40. The second level nitride compound semiconductor layer 52 with p-type conductivity was a Mg-doped GaN layer grown 3000 Å at the doping concentration of $5 \times 10^{19}/cm^3$. The growth temperature was about 850° C. Ammonia and a hydrazine source were used as a nitrogen precursor. A ratio of a third group to fifth group of ammonia was maintained at about 1000, and a ratio of a third group to fifth group of hydrazine source was maintained at about 20.

As shown in the photograph, the pinhole structure was formed in the second level nitride compound semiconductor layer 52 with p-type conductivity.

Figure 4:
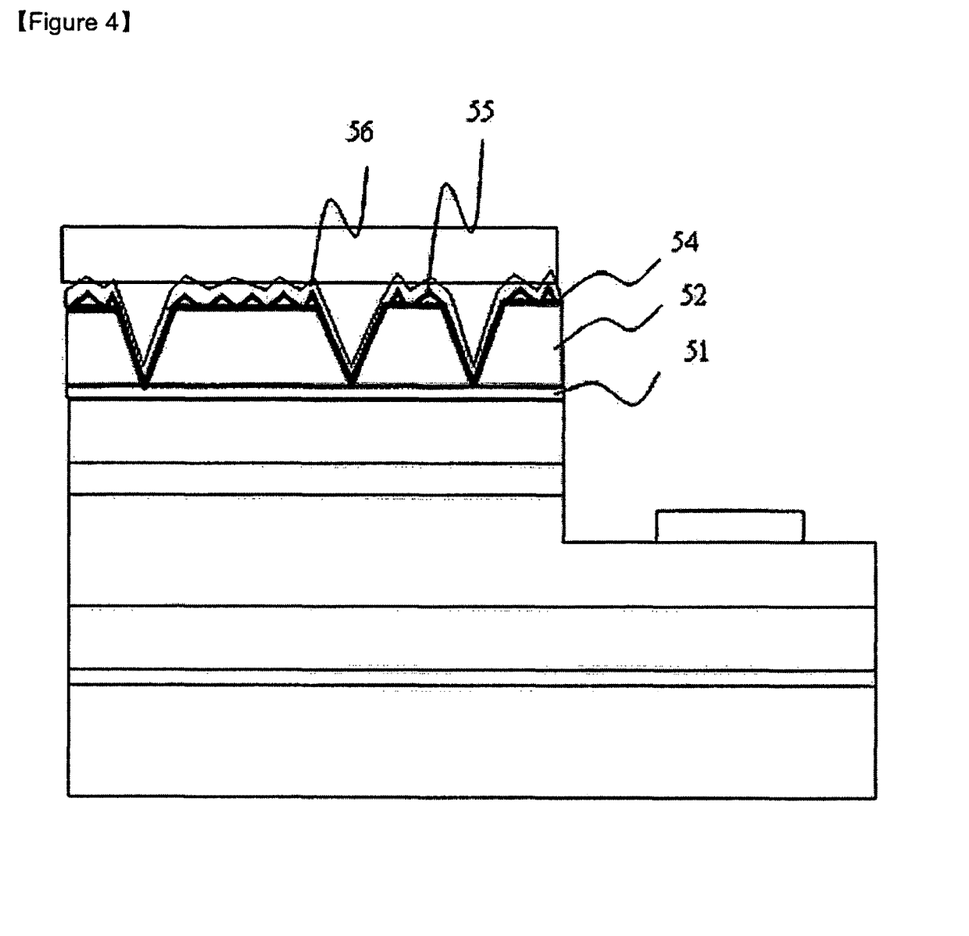
FIG. 4 is a cross-sectional view illustrating a III-nitride compound semiconductor light emitting device in accordance with another embodiment of the present invention.

FIG. 4 is a cross-sectional view illustrating a III-nitride compound semiconductor light emitting device in accordance with another embodiment of the present invention. The III-nitride compound semiconductor light emitting device includes a second level nitride compound semiconductor layer 52 with p-type conductivity grown on a first level nitride compound semiconductor layer 51 with n-type conductivity, a third level masking film 54 grown after the growth of the second level nitride compound semiconductor layer 52 with p-type conductivity, a fourth level nitride compound semiconductor layer 55 with p-type conductivity grown after the growth of the third level masking film 54, and a fifth level nitride compound semiconductor layer 56 with p-type conductivity grown after the growth of the fourth level nitride compound semiconductor layer 55 with p-type conductivity.

The third level masking film 54 is grown by using SiCN, CN, SiN or MgN in order to form the fourth level nitride compound semiconductor layer 55 with p-type conductivity to have a hillock structure. When the fourth level nitride compound semiconductor layer 55 with p-type conductivity is grown after the growth of the third level masking film 54, fine hillocks are formed on the flat portions of the second level nitride compound semiconductor layer 52 with p-type conductivity which do not have pinholes.

Preferably, the thickness of the third level masking film 54 ranges from 2 to 100 Å. If the thickness of the masking film 54 is below 2 Å, the masking film 54 is not normally operated. If the thickness of the masking film 54 is over 100 Å, the density of the hillock structure is reduced. In addition, the masking film 54 is preferably grown at the same temperature as the growth temperature of the second level nitride compound semiconductor layer 52 with p-type conductivity, between 600 and 1100° C. If the growth temperature is lower than 600° C., the making film 54 is not easily generated, and if the growth temperature is higher than 1100° C., the masking film 54 is decomposed during the growth. In the formation of the masking film 54, a Si supply source is selected from the group consisting of $SiH_4$, $Si_2H_6$ and DTBSi, a C supply source is selected from the group consisting of $CH_4$, $C_2H_6$ and $CBr_4$, a Mg supply source is selected from the group consisting of $Mg(C_5H_5)_2$ and $Mg(C_6H_7)_2$, and a N supply source is selected from the group consisting of $NH_3$ and hydrazine sources.

The fourth level nitride compound semiconductor layer 55 with p-type conductivity is formed by Mg doping, and grown with the hillock structure on the flat portions of the second level nitride compound semiconductor layer 52 with p-type conductivity. As a result, the high density pinholes and hillocks are combined in the device, to improve external quantum efficiency.

The growth temperature of the fourth level nitride compound semiconductor layer 55 with p-type conductivity ranges from 600 to 1100° C. If the growth temperature rises, the distance and height differences between the hillocks increase. If the growth temperature is lowered, the hillocks can be relatively regularly formed on the whole surface. Preferably, the thickness of the fourth level nitride compound semiconductor layer 55 ranges from 100 to 10000 Å. If the thickness of the fourth level nitride compound semiconductor layer 55 is below 100 Å, the hillock structure is not formed thereon. If the thickness of the fourth level nitride compound semiconductor layer 55 is over 10000 Å, quality of the thin film is deteriorated.

The fourth level nitride compound semiconductor layer 55 with p-type conductivity can be formed by using a single semiconductor layer with p-type conductivity, or inserting a semiconductor layer with n-type conductivity. In this case, the semiconductor layer with n-type conductivity is preferably formed below 100 Å, in consideration of the hole tunneling.

To form a contact layer with an excellent crystalline property, the fifth level nitride compound semiconductor layer 56 with p-type conductivity, which has high Mg concentration and hole concentration, is grown on the fourth level nitride compound semiconductor layer 55 with p-type conductivity. Preferably, while the fifth level nitride compound semiconductor layer 56 with p-type conductivity is formed, the growth temperature is getting raised to prevent planarization of the pinhole structure and the hillock structure.

Preferably, the thickness of the fifth level nitride compound semiconductor layer 56 with p-type conductivity ranges from 10 to 10000 Å. If the thickness of the fifth level nitride compound semiconductor layer 56 is below 10 Å, the fifth level nitride compound semiconductor layer 56 cannot serve as a contact layer. If the thickness of the fifth level nitride compound semiconductor layer 56 is over 10000 Å, quality of the thin film is deteriorated. It is thus difficult to the form a light transmitable electrode. Preferably, the growth temperature of the fifth level nitride compound semiconductor layer 56 ranges from 700 to 1100° C. If the growth temperature is lower than 700° C., the fifth level nitride compound semiconductor layer 56 cannot be doped at a high concentration. If the growth temperature is higher than 1100° C., the fifth level nitride compound semiconductor layer 56 is decomposed.

The fifth level nitride compound semiconductor layer 56 with p-type conductivity can be formed by using a single semiconductor layer with p-type conductivity, or inserting a semiconductor layer with n-type conductivity. In this case, the semiconductor layer with n-type conductivity is preferably formed below 100 Å, in consideration of the hole tunneling.

Figure 5:
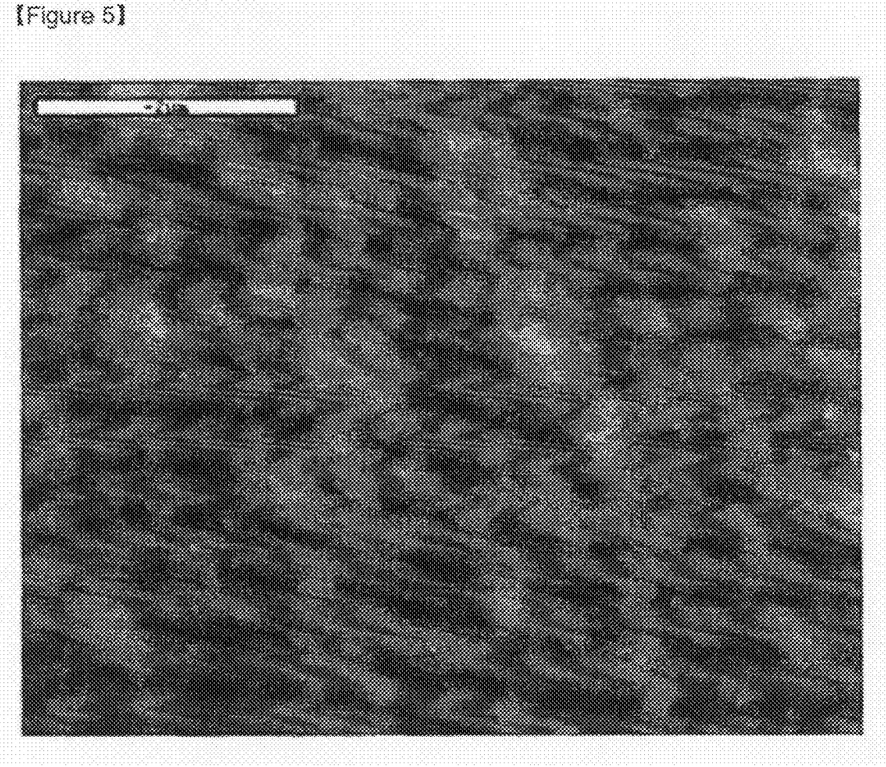
FIG. 5 is a photograph showing a surface of a fifth level nitride compound semiconductor layer in accordance with the present invention.

FIG. 5 is a photograph showing the surface of the fourth level nitride compound semiconductor layer with p-type conductivity, especially an SEM photograph showing the surface of the light emitting device in accordance with the present invention. The third level masking film 54 was grown about 20 Å at a temperature of about 900° C. DTBSi selected from the group consisting of $SiH_4$, $Si_2H_6$ and DTBSi was used as the Si supply source, $CBr_4$ selected from the group consisting of $CH_4$, $C_2H_6$ and $CBr_4$ was used as the C supply source, and $NH_3$ selected from the group consisting of $NH_3$ and hydrazine sources was used as the N supply source. Here, the ratio of DTBSi to $CBr_4$ was maintained about 1:4, and 6000 sccm of ammonia was used.

The fourth level nitride compound semiconductor layer 55 with p-type conductivity was a Mg-doped GaN layer. The growth temperature was 900° C. When it was presumed that the fourth level nitride compound semiconductor layer 55 was grown flat, the thickness thereof was expected between about 300 and 400 Å. As shown in the photograph, the hillock structure was formed on the fourth level nitride compound semiconductor layer 55 with p-type conductivity.

Preferably, the fourth level nitride compound semiconductor layer 55 with p-type conductivity and the fifth level nitride compound semiconductor layer 56 with p-type conductivity are provided with different refractive indexes by changing the composition or density.

The present invention also provides a III-nitride compound semiconductor light emitting device which does not include the first level nitride compound semiconductor layer 51 with n-type conductivity. That is, the III-nitride compound semiconductor light emitting device includes the second level nitride compound semiconductor layer 52 with p-type conductivity grown on the p-type nitride compound semiconductor layer, the third level masking film 54 grown after the growth of the second level nitride compound semiconductor layer 52 with p-type conductivity, the fourth level nitride compound semiconductor layer 55 with p-type conductivity grown after the growth of the third level masking film 54, and the fifth level nitride compound semiconductor layer 56 with p-type conductivity grown after the growth of the fourth level nitride compound semiconductor layer 55 with p-type conductivity.

The invention claimed is:

1. A III-nitride compound semiconductor light emitting device comprising;
   an n-type nitride compound semiconductor layer;
   an active layer grown over the n-type nitride compound semiconductor layer, for generating light by recombination of electron and hole;
   a p-type nitride compound semiconductor layer grown over the active layer; and
   a plurality of semiconductor layers including:
   a nitride compound semiconductor layer with n-type conductivity grown over the p-type nitride compound semiconductor layer, and
   a nitride compound semiconductor layer with a pinhole structure grown on the nitride compound semiconductor layer with n-type conductivity,
   wherein the nitride compound semiconductor layer with a pinhole structure has p-type conductivity, and
   wherein the pinhole structure is formed on the basis of lattice defects of the nitride compound semiconductor layer with n-type conductivity.

2. The III-nitride compound semiconductor light emitting device of claim 1, wherein the plurality of semiconductor layers further include a nitride compound semiconductor layer with p-type conductivity over the nitride compound semiconductor layer with the pinhole structure.

3. The III-nitride compound semiconductor light emitting device of claim 1, wherein the nitride compound semiconductor layer with n-type conductivity has a thickness of 100 Å and below.

4. The III-nitride compound semiconductor light emitting device of claim 2, wherein the nitride compound semiconductor layer with p-type conductivity is grown at a first growth temperature, the nitride compound semiconductor layer with the pinhole structure is grown at a second growth temperature, and the first growth temperature is higher than the second growth temperature.

5. The III-nitride compound semiconductor light emitting device of claim 2, wherein at least one nitride compound semiconductor layer with n-type conductivity is formed by 100 Å and below inside the semiconductor layer with the pinhole structure and the nitride compound semiconductor layer with p-type conductivity, respectively.

6. A III-nitride compound semiconductor light emitting device comprising;
   an n-type nitride compound semiconductor layer;
   an active layer grown over the n-type nitride compound semiconductor layer, for generating light by recombination of electron and hole;
   a p-type nitride compound semiconductor layer grown over the active layer;
   a nitride compound semiconductor layer with n-type conductivity grown over the p-type nitride compound semiconductor layer;
   a nitride compound semiconductor layer with a pinhole structure grown on the nitride compound semiconductor layer with n-type conductivity, wherein the nitride compound semiconductor layer with a pinhole structure has p-type conductivity, and the pinhole structure is formed on the basis of lattice defects of the nitride compound semiconductor layer with n-type conductivity; and
   a masking film and a plurality of nitride compound semiconductor layers grown over the nitride compound semiconductor layer with the pinhole structure.

7. The III-nitride compound semiconductor light emitting device of claim 6, wherein the masking film is made of a material selected from the group consisting of SiN, CN, MgN and SiCN.

8. The III-nitride compound semiconductor light emitting device of claim 6, wherein at least one nitride compound semiconductor layer with n-type conductivity is formed by 100 Å and below inside the nitride compound semiconductor layer with the pinhole structure.

9. The III-nitride compound semiconductor light emitting device of claim 6, wherein the nitride compound semiconductor layer with n-type conductivity has a thickness of 100 Å and below.

10. A III-nitride compound semiconductor light emitting device comprising;
    an n-type nitride compound semiconductor layer;
    an active layer grown over the n-type nitride compound semiconductor layer;
    a p-type nitride compound semiconductor layer grown over the active layer;

a plurality of semiconductor layers including a nitride compound semiconductor layer with n-type conductivity grown over the p-type nitride compound semiconductor layer, and a nitride compound semiconductor layer with a pinhole structure grown on the p-type nitride compound semiconductor layer; and a masking film and a plurality of nitride compound semiconductor layers grown over the nitride compound semiconductor layer with the pinhole structure, wherein the plurality of semiconductor layers comprises a nitride compound semiconductor layer with p-type conductivity grown over the masking film.

11. The III-nitride compound semiconductor light emitting device of claim 10, wherein the nitride compound semiconductor layer with p-type conductivity is formed in an island shape.

12. The III-nitride compound semiconductor light emitting device of claim 10, wherein the plurality of nitride compound semiconductor layers comprise an additional nitride compound semiconductor layer with p-type conductivity grown on the nitride compound semiconductor layer with p-type conductivity.

13. The III-nitride compound semiconductor light emitting device of claim 10, wherein at least one nitride compound semiconductor layer with n-type conductivity is formed by 100 Å and below inside the nitride compound semiconductor layer with p-type conductivity.

14. The III-nitride compound semiconductor light emitting device of claim 12, wherein the nitride compound semiconductor layer with p-type conductivity is grown at a first growth temperature, the additional nitride compound semiconductor layer with p-type conductivity is grown at a second growth temperature, and the first growth temperature is lower than the second growth temperature.

* * * * *